United States Patent
Pie et al.

(10) Patent No.: US 7,039,886 B2
(45) Date of Patent: May 2, 2006

(54) SYSTEMS AND METHODS FOR GENERATING TEST VECTORS TO ANALYZE CELLS OF ELECTRONIC GATES

(75) Inventors: Charles Corey Pie, Fort Collins, CO (US); Eric Matthew Lee, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 450 days.

(21) Appl. No.: 10/445,500

(22) Filed: May 27, 2003

(65) Prior Publication Data

US 2004/0243948 A1   Dec. 2, 2004

(51) Int. Cl.
*G06F 17/50* (2006.01)

(52) U.S. Cl. ............................ 716/4; 716/6; 716/18

(58) Field of Classification Search ............... 716/4–6, 716/18
See application file for complete search history.

(56) References Cited

U.S. PATENT DOCUMENTS

| | | | | | |
|---|---|---|---|---|---|
| 5,345,393 | A | * | 9/1994 | Ueda ........................... | 716/18 |
| 6,042,613 | A | * | 3/2000 | Tsukamoto .................. | 716/18 |
| 6,075,932 | A | * | 6/2000 | Khouja et al. ................ | 716/4 |
| 2002/0100006 | A1 | * | 7/2002 | Kosugi ......................... | 716/6 |

* cited by examiner

*Primary Examiner*—Paul Dinh

(57) ABSTRACT

Systems, software products and methods generate test vectors to analyze cells of electronic gates. A cell of a cell library is electronically selected. Input combinations of stimuli for the cell are determined. One or more input combinations are removed that do not affect maximum and minimum signal propagation timing through the cell. Test vectors for the cell are generated based upon remaining input combinations.

18 Claims, 5 Drawing Sheets

SYSTEMS AND METHODS FOR GENERATING TEST VECTORS TO ANALYZE CELLS OF ELECTRONIC GATES

BACKGROUND

A computer aided design ("CAD") tool is used to generate layouts for integrated circuitry. The CAD tool builds an integrated circuit design by utilizing pre-defined groups of electronic gates (known as "cells") stored in a cell library. Each of the electronic gates is formed by one or more field effect transistors (FETs) characterized in polarity as either p-type or n-type. A cell tool is used by a designer to create and edit the cells. A SPICE tool is then used to simulate the operational behavior of each cell to determine maximum and minimum signal propagation timing therein. The SPICE tool utilizes schematic component and connectivity information from the cell library, gate performance information from a gate library (typically supplied by a manufacturer), and a list of test vectors specifying input stimulation for each cell. These test vectors are written by a designer to ensure stimulation of the circuit paths associated with the maximum and minimum signal propagation timing. The signal propagation timing for each cell is then stored in a characterization library. Thereafter, the CAD tool uses cell schematic information from the cell library and cell characterization information from the characterization library to specify the integrated circuit design.

The writing of test vectors and the use of the test vectors with the SPICE tool during cell simulation is labor-intensive and time-consuming. Any changes to gate definitions in the gate library, or to cells in the cell library, require that (a) the test vectors be updated and (b) the SPICE tool re-simulate the cells to update the characterization information in the characterization database.

SUMMARY OF THE INVENTION

In certain embodiments, a method generates test vectors to analyze cells of electronic gates, including: electronically selecting one cell within a cell library;
determining input combinations of stimuli for the one cell; removing one or more of the input combinations that do not affect maximum and minimum signal propagation timing through the one cell; and generating the test vectors for the one cell based upon remaining input combinations.

In certain embodiments, a software product includes instructions, stored on computer-readable media, wherein the instructions, when executed by a computer, perform steps for generating test vectors to analyze cells of gates, including:
selecting one cell from a cell library; determining input combinations of inputs and associated states for the one cell; removing one or more of the input combinations that do not affect maximum and minimum signal propagation timing through the one cell; and
generating the test vectors for the one cell based upon remaining input combinations.

In certain embodiments, a system generates test vectors to analyze cells of electronic gates, including: means for electronically selecting one or more cells within a cell library; means for determining a group of input combinations associating input stimuli with inputs of each of the cells; means for removing one or more of the input combinations that do not affect maximum and minimum signal propagation timing through the each of the cells; and means for generating the test vectors for each cell based upon remaining input combinations.

In certain embodiments, a system generates test vectors to analyze cells of electronic gates. A cell library defines one or more cells. A gate library defines electronic gates used within the cells. A vector generator processes the cells to generate test vectors containing input combinations that affect maximum and minimum signal propagation timing through electronic gates.

BRIEF DESCRIPTION OF DIAGRAMS

DETAILED DESCRIPTION OF DIAGRAMS

In one embodiment, test vectors are automatically generated for one or more cells of electronic gates. The cells are stored in a cell library and are individually processed to determine input combinations for each cell. Input combinations that do not affect maximum and minimum signal propagation timing through cells are removed, such that remaining input combinations define the test vectors. These test vectors are for example used by a SPICE tool to simulate and characterize signal propagation timing of the cell.

Each cell has one or more inputs. In one embodiment, each of these inputs is associated with an input stimuli state. By way of example, each input to a cell may have one of following four input stimuli states: low (L), high (H), rising (R) or falling (F). An "input combination" therefore means one or more inputs to the cell and associated input stimuli states. Using the above example of four input stimuli states, a cell with two inputs has $4^2$ input combinations. If the cell has three inputs, and there are three input stimuli states, then the cell has $3^3$ input combinations, and so on.

An input stimulus of either R or F is known as a switching stimulus. In one embodiment, input combinations that do not contain R or F states are discarded as such input combinations do not generate timing information during simulation of the cell. In another embodiment, input combinations that contain both R and F states and inputs connected to common type FETs connected in parallel are discarded since such input combinations do not produce timing information during simulation of the cell. "Common type" FETs mean a plurality of FETs that are either p-type or n-type.

Other input combinations may be removed. In one example, input combinations that contain two or more switching stimuli associated with inputs connected to common type parallel FETs are removed if one or more other inputs to the common type parallel FETs associate with non-switching stimuli (e.g., L or H states). In another example, multiple switching input combinations for cells with p-type parallel FETs with inputs only associated with the R state are removed. Similarly, in another example, input combinations for cells with n-type parallel FETs with inputs only associated with the F state are removed. In another example, each of the input combinations that has a pair of inputs connected to the parallel FETs are removed where one input of the pair is associated with either an R or an F state and (a) the parallel FETs are p-type and the other input of the pair associates with an L state or (b) the parallel FETs are n-type and the other input of the pair associates with an H state. In another example, input combinations for one or more cells may be excluded by mutually exclusive ("mutex") commands and/or input directives located in a configuration file.

Figure 1:
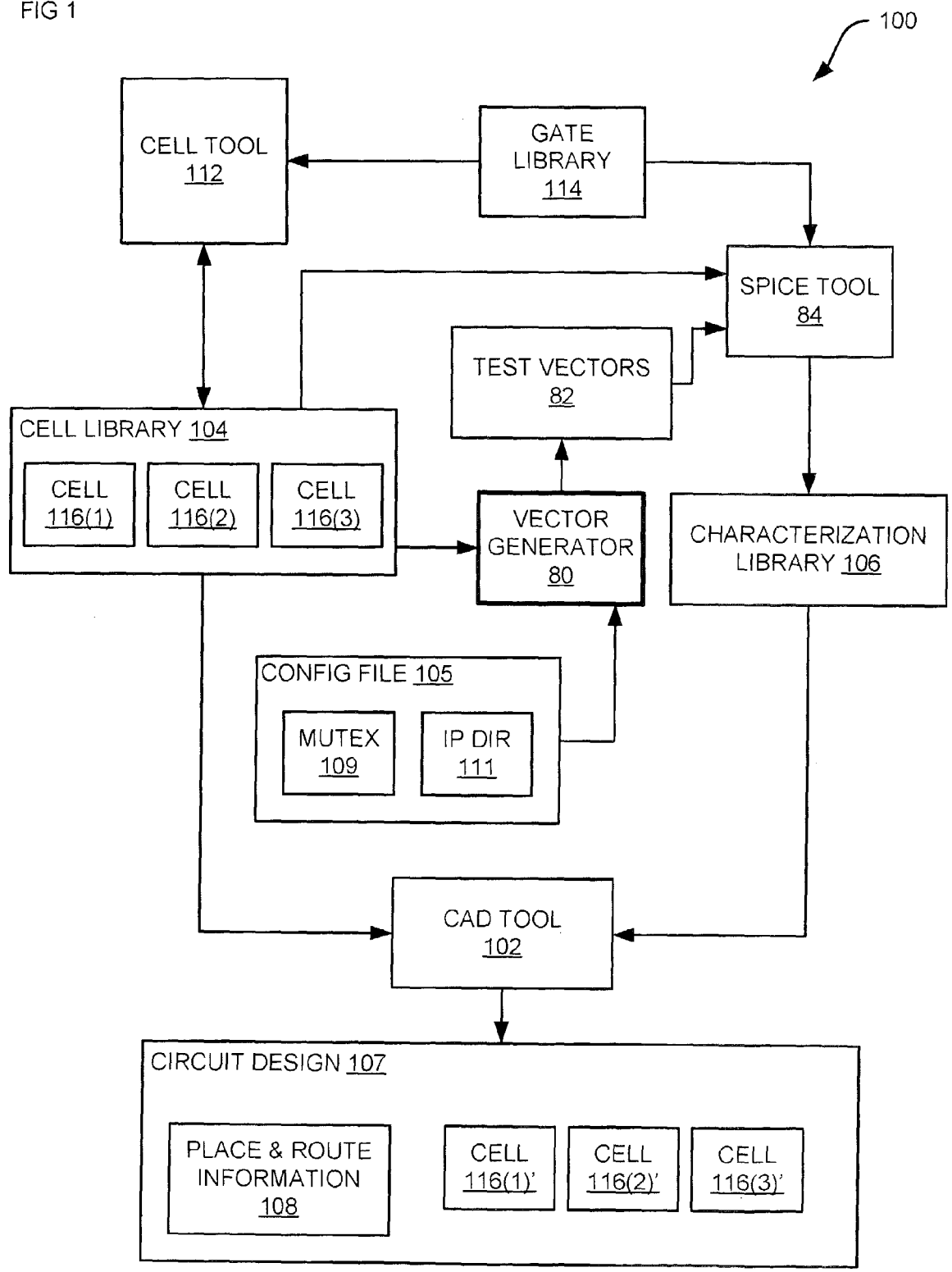
FIG. 1 is a block diagram illustrating one system for generating test vectors to analyze cells of electronic gates.

FIG. 1 is a block diagram illustrating one system 100 that generates test vectors 82 to analyze cells of electronic gates. System 100 has a cell tool 112 that generates a cell library 104, a vector generator 80 that generates test vectors 82, and a gate library 114 that stores gate definitions. A SPICE tool 84 uses test vectors 82 to generate a cell characterization library 106. CAD tool 102 uses cell library 104 and characterization library 106 to specify an integrated circuit design 107. An exemplary CAD tool 102 is an integrated circuit design tool suite by Synopsys, Inc.

In operation, through cell tool 112, a user selects gates from gate library 114 to build a plurality of cells 116 stored in cell library 104. One or more cells 116 of cell library 104 may be loaded into integrated circuit 107 as cells 116'. Integrated circuit design 107 is shown with three cells 116(1)', 116(2)', and 116(3)' (representing cells 116(1), 116(2) and 116(3), respectively, of cell library 104) to provide functionality for integrated circuit design 107. Those having ordinary skill in the art appreciate that many more cells 116, 116' may be included within system 100 as a matter of design choice.

Vector generator 80 analyzes one or more cells 116 of cell library 104 to produce test vectors 82, used in cell testing. Specifically, test vectors 82 define input stimuli for each cell 116 in which signal propagation is to be simulated and measured. In one embodiment, test vectors 82 specify input stimuli to be one of the following: low (L), high (H), falling (F), and rising (R). An input stimulus specified as L or H remains at that state for the duration of simulation. An input stimulus specified as R is initially set to L and transitioned to H during the simulation. Likewise, an input stimulus specified as F is initially set to H and transitioned to L during the simulation.

SPICE tool 84 utilizes test vectors 82, gate library 114, and cell library 104 to simulate each cell 116 so as to characterize minimum and maximum signal propagation timing, which is then stored in characterization library 106. CAD tool 102 retrieves schematic information for cells 116(1), 116(2) and 116(3) from cell library 104 and signal propagation timing from characterization database 106 to determine gate placement and routing information 108 for cells 116(1)', 116(2)' and 116(3)'.

Optionally, a configuration file 105 may be created to store mutually exclusive ("mutex") commands 109 and input directives 111 for specific cells 116 in cell library 104. Mutex commands 109 identify mutually exclusive inputs for cell 116 and instruct vector generator 80 to restrict stimulation of defined inputs of cell 116 during testing. Input directives 111 define input stimuli conditions that may further restrict input combinations of vector generator 80.

Figure 2:
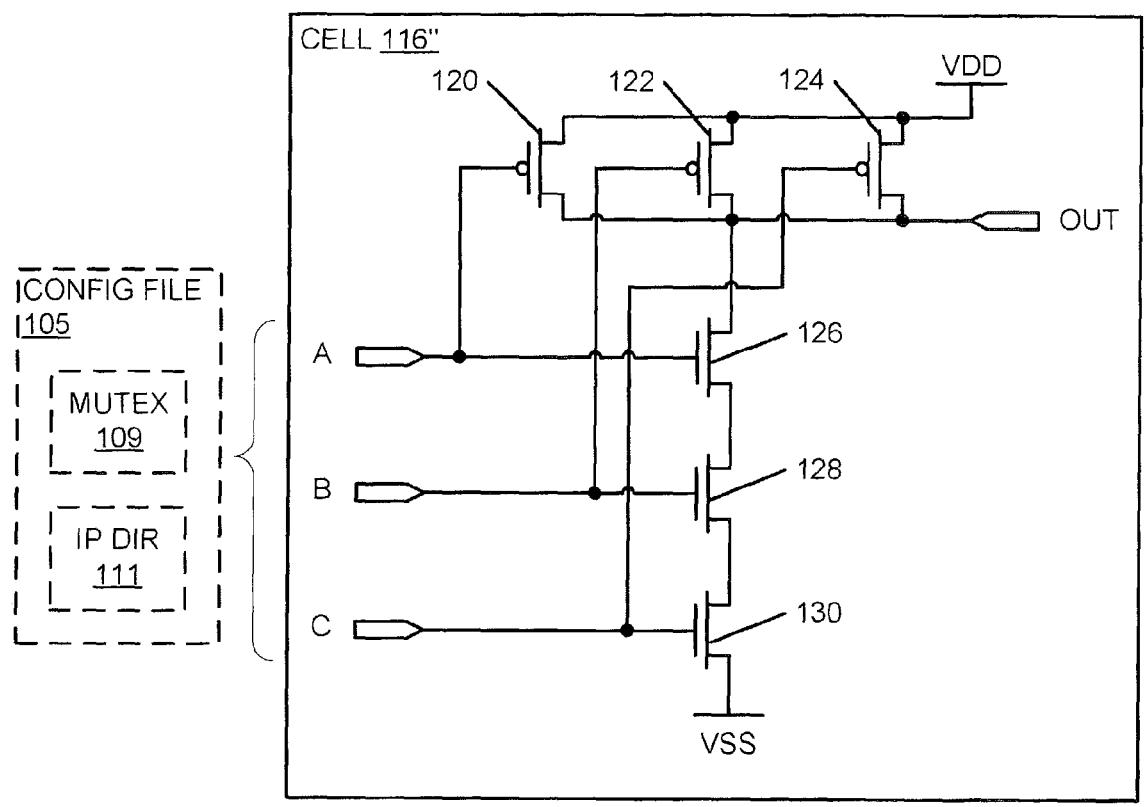
FIG. 2 is a block diagram illustrating one example of a cell constructed from electronic gates.

FIG. 2 shows one example of a cell 116" stored in cell library 104. In this example, cell 116" defines a three input NAND gate constructed from six field effect transistors ("FETs"), each selected from gate library 114. In particular, cell 116" has three p-type FETs 120, 122, and 124, and three n-type FETs 126, 128 and 130, which form the NAND gate. Cell 116" is also shown with three inputs A, B and C, and one output, OUT. P-type FETs 120, 122 and 124 are connected in parallel between Voltage Drain Drain ("VDD") and OUT, while n-type FETs 126, 128 and 130 are connected in series between OUT and voltage for substrate and sources ("VSS"). Cell 116" is powered by connections VDD and VSS.

FIG. 2 also schematically illustrates configuration file 105, optionally used to control input testing configurations of cell 116", through mutex commands 109 and input directives 111. By way of example, mutex commands 109 may limit certain tests to only one input, for example only one of A, B or C as H or R state. In another example, input directives 111 may restrict inputs to defined combinations of A, B and C.

Figure 3:
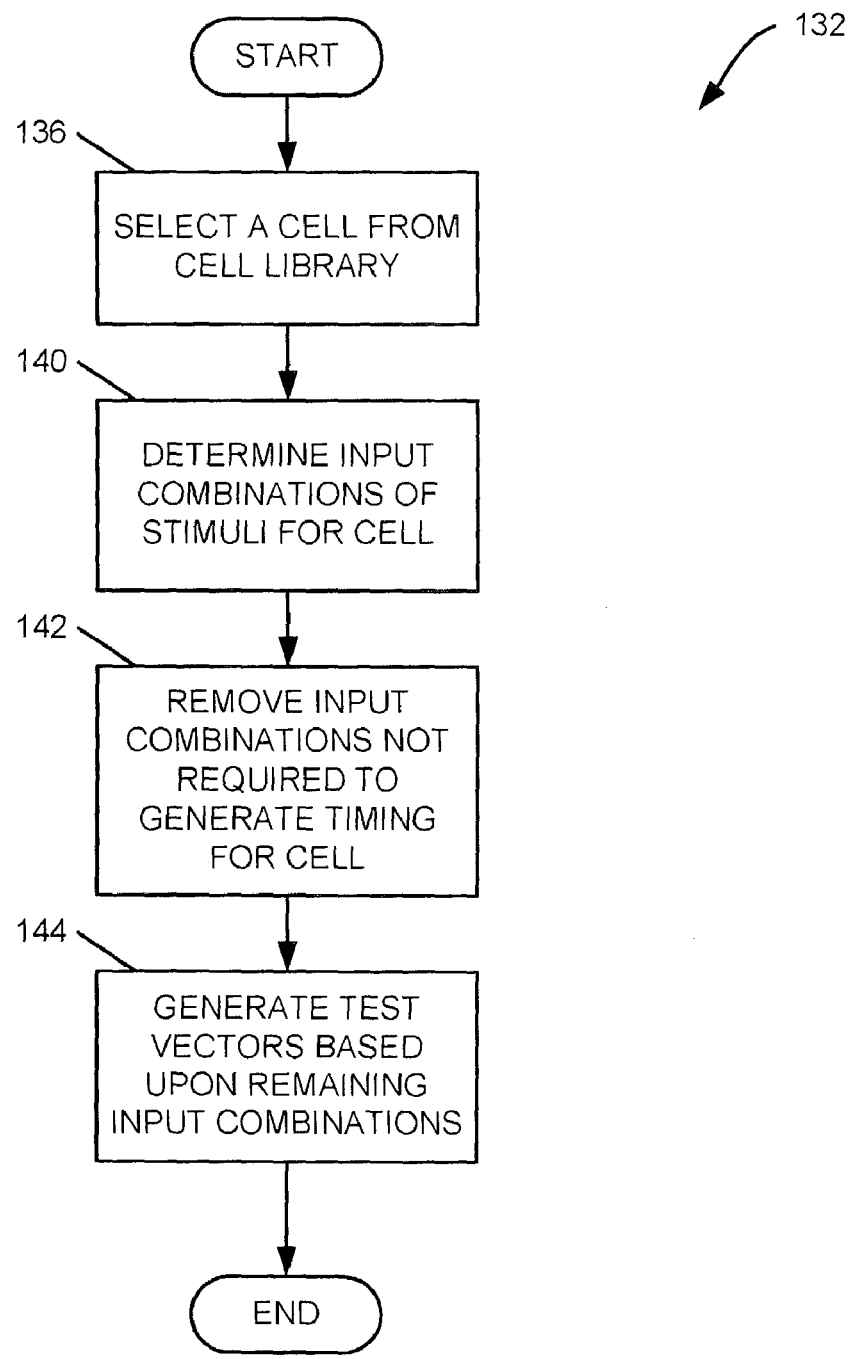
FIG. 3 is a flow chart illustrating one process for generating test vectors to analyze cells of electronic gates.

FIG. 3 is a flowchart illustrating one process 132 that generates test vectors 82 for a cell of electronic gates. Step 136 selects the cell (e.g., cell 116(1)) to be processed from cell library 104. Step 140 analyses the cell selected in step 136 to determine one or more input combinations for inputs and input stimuli for the selected cell. All input combinations may for example be determined. The determined input combinations may be stored in a list.

Step 142 analyses the cell to remove input combinations, defined in step 140, that do not characterize minimum or maximum propagation timing through the cell. Step 144 generates test vectors 82 based upon remaining input combinations. Process 132 then terminates.

Figure 4:
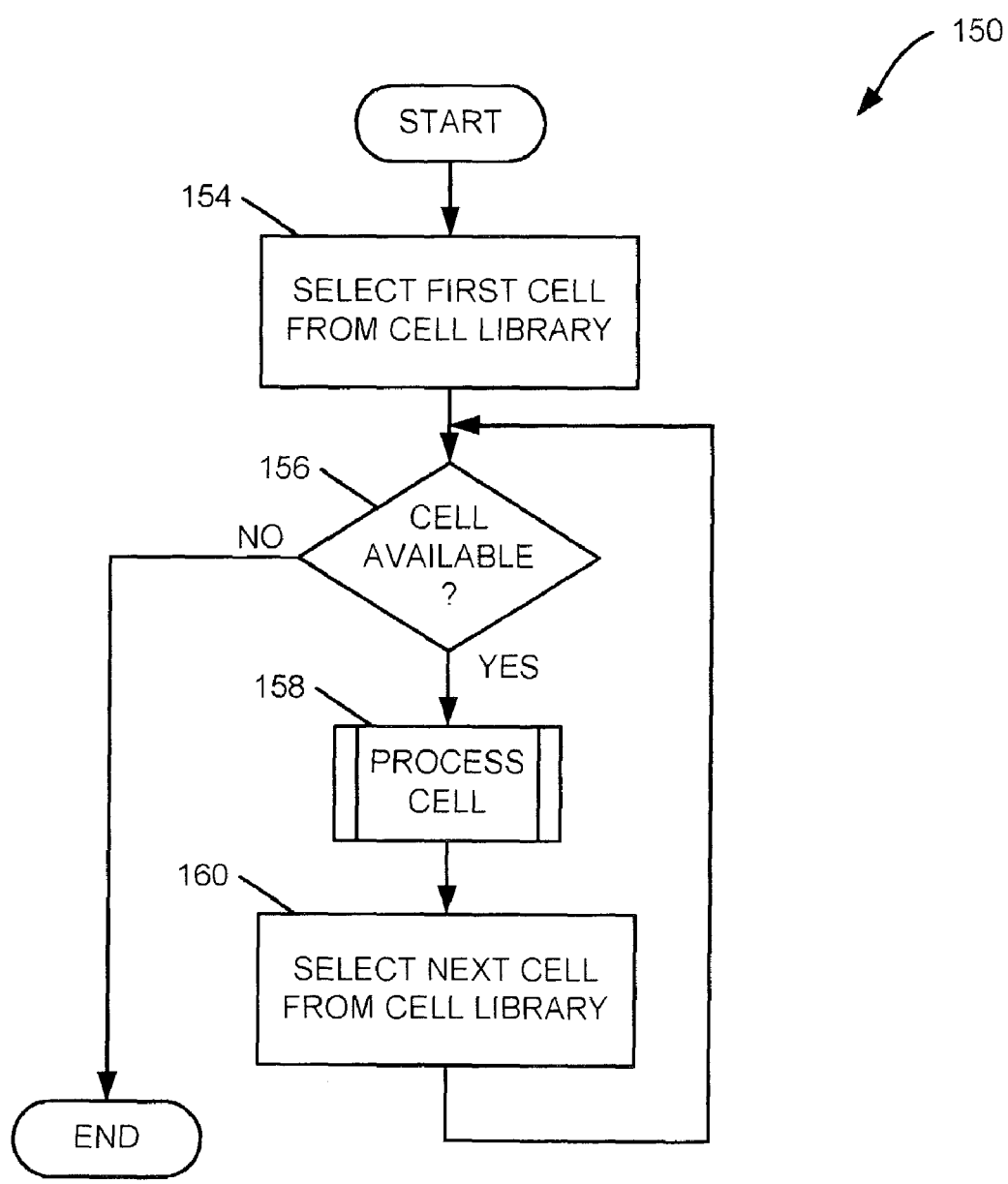
FIG. 4 is a flow chart illustrating one process for generating test vectors to analyze cells of electronic gates.

FIG. 4 is a flowchart illustrating one process 150 that generates test vectors 82 for one or more cells 116 in cell library 104. Step 154 selects a first cell (e.g., cell 116(1)) to be processed from cell library 104.

Step 156 is a decision. If the cell was successfully selected in step 154, process 150 continues with step 158; otherwise if a cell is not available in step 154, process 150 terminates at step 162.

Step 158 calls a sub-process 170 (FIG. 4) to generate test vectors for the selected cell of step 154. On return from sub-process 170, process 150 continues with step 160.

Step 160 selects the next cell (e.g., cell 116(2)) from cell library 104. At each call, step 160 thereby selects each unprocessed cell (e.g., 116(2), 116(3), etc.) in turn from cell library 104, for processing by sub-process 170.

When the cells 116 of library 104 are processed by step 158, step 160 is not able to select another cell and process 150 terminates. Cells 116(1)–116(3) are shown illustratively within process 150 and should not be construed as limiting, since process 150 may process more cells as a matter of design choice. When a next cell is available, process 150 continues with step 156, as shown.

Figure 5:
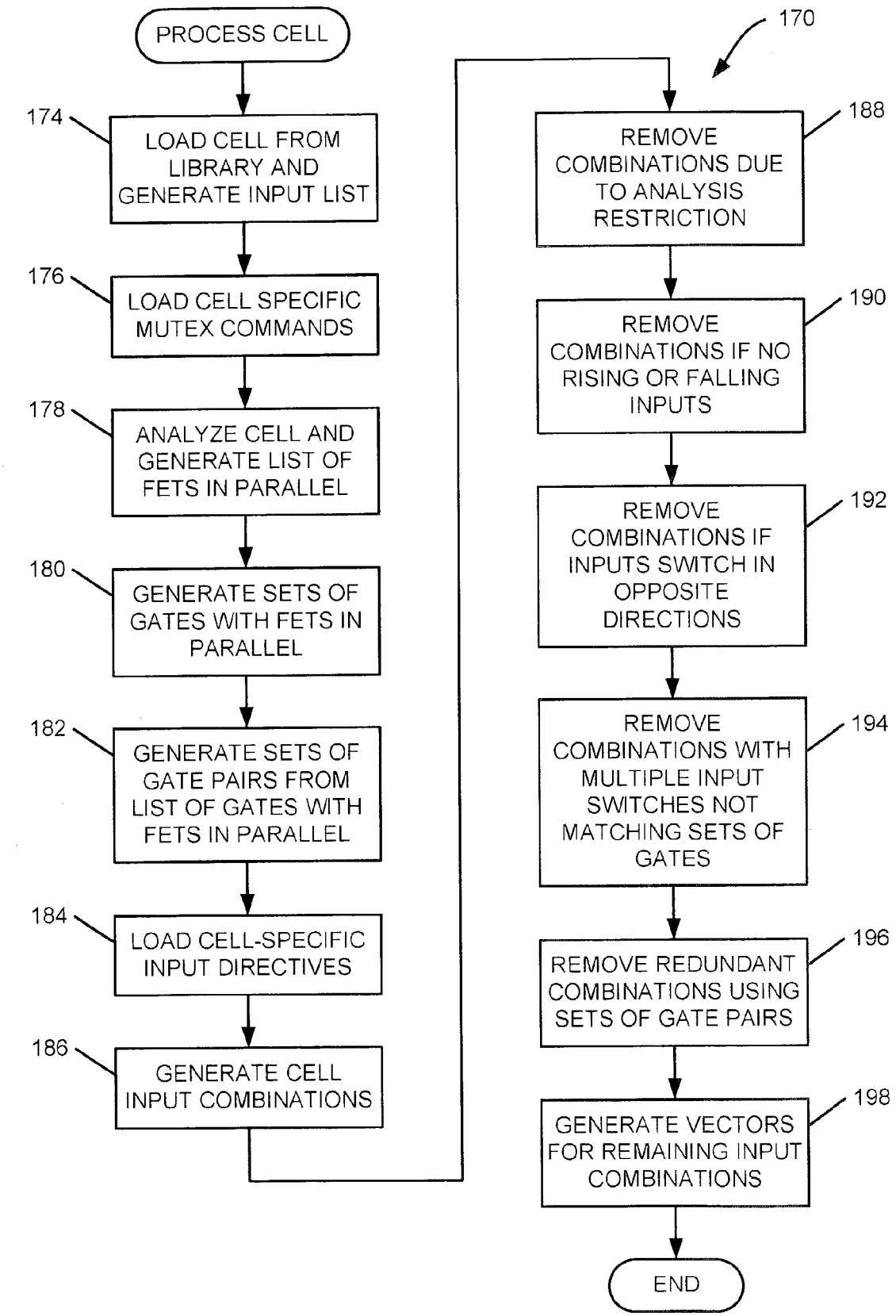
FIG. 5 is a flow chart illustrating one sub-process for analyzing one cell.

FIG. 5 is a flow chart illustrating sub-process 170 to generate test vectors 82 for one or more cells 116 in cell library 104. Step 174 loads cell 116 from cell library 104. Cell 116 is analyzed to generate a list of cell inputs. For example, cell 116", FIG. 2, has three inputs A, B, and C; thus step 174 in this example generates A, B and C for cell 116".

Step 176 loads mutex commands 109 specific to the current cell from a user generated configuration file 105, if any. Mutex commands 109 identify mutually exclusive input groups and instruct vector generator 80 to restrict input stimulation according to the mutex commands. In one example, when the current cell is a mux, a cell designer may for example write mutex commands 109 to the configuration file 105 so as to restrict input stimulus to the cell, such as where only one input to the mux is active at any one time.

Step 178 analyzes cell 116 to generate a list containing FETs connected in parallel. FETs are connected in parallel when their sources connect to the same point, their drains connect to the same point, and their gates connect to different points and the FETs are of the same common type (p-type or n-type). In the illustrated embodiment, cell 116" has three parallel FETs: p-type FET 120, p-type FET 122 and p-type FET 124. In the example of FIG. 2, FETs 120, 122 and 124 are thus entered into the list in step 178.

Step 180 uses the list of step 178 to generate a gate set list. The gate set list defines sets of gates for the parallel FETs and further defines each FET type. In the illustrated embodiment, cell 116" has only one set of parallel FETs and, therefore, step 180 generates one set in the gate set list consisting of A, B, C, and type p-type FET.

Step 182 generates a gate pair list from the gate set list of step 160. The gate pair list defines sets of gate pairs and FET type. The gate pair list is constructed by making unique gate pairs for each gate set in the gate set list. In the illustrated embodiment, cell 116" has three gate pair sets: (A, B, p-type), (A, C, p-type), and (B, C, p-type). These gate pair sets are entered into the gate pair list in step 182.

Step 184 loads cell specific input directives 111 from the configuration file 105, if any. Input directives 105 define input stimuli conditions that may restrict input combinations generated by vector generator 80. For example, input directives 109 may restrict input stimuli on an input to be either (a) a fixed H or (b) R. In another example, input directives 109 may specify that if one input is H then a second input must be L or F. Input directives 109 are optional and specific to each cell design.

Step 186 generates a list of input combinations for the cell being processed, by using the input list of step 174. In the illustrated embodiment, cell 116" has three inputs. Each input may have one of four stimuli (H, L, R, and F), and, therefore, step 186 generates a list of sixty-four input combinations.

Step 188 removes input combinations that are excluded by the mutex commands 109 of step 176 or the input directives 111 of step 184, if any. For example, if the current cell defines a mux, and a mutex command specifies only one of four inputs are active at any one time, step 188 is operable to remove any input combination where more than one input is active.

Step 190 removes input combinations that do not have a rising (R) or falling (F) input state, as such combinations do not generate propagation timing information during cell simulation. In the illustrated embodiment, an input combination of A=L, B=L and C=H for cell 116" is discarded in step 190 as there are no inputs that switch states. However, an input combination of A=L, B=H and C=R for cell 116" is not discarded in step 190.

Step 192 removes input combinations that have inputs switching in opposite directions. In the illustrated embodiment, an input combination of A=R, B=F, C=F for cell 116" is discarded in step 192 as inputs A and B switch in opposite directions, resulting in no change to the output of parallel FETs 120 and 122; accordingly no timing information is generated during simulation of cell 116" with this input combination.

Step 194 removes input combinations with multiple switching inputs that do not match an entry in the gate set list of step 180. An F stimulus matches a p-type FET gate and an R stimulus matches an n-type FET gate in the gate set list. An input combination matches an entry in the gate set list if all stimuli are of the same state, and the state matches the FET type. In the illustrated embodiment, an input combination of A=R, B=R, C=R for cell 116" is discarded by step 194 as rising (R) input stimuli are not analyzed for p-type parallel FETs.-By contrast, an input combination of A=F, B=F, C=F for cell 116" is not discarded by step 194. A combination of A=F, B=F C=H is discarded as the input combination is not matched by the gate set list for cell 116".

Step 196 uses the gate pair list of step 182 to create logic expressions that further remove redundant input combinations. For example, if two p-type FETs are in parallel and one has an input stimulus of L, then any stimuli applied to the input of the second FET will have no effect since the first FET remains on because of its L input stimulus. In the illustrated embodiment, an input combination of A=R, B=H, C=H for cell 116" is not discarded by step 196 as the FETs are p-type, whereas an input combination of A=R, B=L, C=H is discarded by step 196 as p-type FET 122 remains on for the duration of the simulation, due to input B remaining L.

Step 198 generates test vectors 82 for the remaining input combinations. Test vectors 82 stimulate inputs of each cell 116 such that maximum and minimum signal propagation timing is generated during simulation by SPICE tool 84. Sub-process 170 then terminates, returning control to the calling process 158, FIG. 4.

The ordering of steps 174 through 198 may change without departing from the scope hereof. For example, the step of loading cell specific mutex commands 176 and the step of loading cell specific input directives 184 may occur before the step of loading the cell from the cell library 174.

In one embodiment, the number of possible input combinations for a cell is $4^n$, where n is the number of inputs to the cell and there are four input stimuli. In the example of FIG. 2, the number of possible test vectors is reduced from 64 to 7 for cell 116" by vector generation process 150. Process 150 thus generates test vectors for the input combinations shown in Table 1 for cell 116".

TABLE 1

Input Combinations for Cell 116".

| Input A | Input B | Input C |
|---------|---------|---------|
| F | F | F |
| R | H | H |
| F | H | H |
| H | R | H |
| H | F | H |
| H | H | R |
| H | H | F |

As appreciated by those having ordinary skill in the art, any changes to gate definitions in gate library 114, resulting from changes in a manufacturing process, for example, require that all cells be re-simulated to generate new characterization information for characterization library 106. With system 100, FIG. 1, the generation and updating of characterization library 106 is completed quickly and with minimal user intervention.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

The invention claimed is:

1. A method for generating test vectors to analyze cells of electronic gates, comprising:
    electronically selecting one cell within a cell library;

determining input combinations of stimuli for the one cell;

removing one or more input combinations that do not affect maximum and minimum signal propagation timing through the one cell; and generating the test vectors for the one cell based upon remaining input combinations.

2. The method of claim 1, further comprising electronically selecting one or more additional cells within the cell library, and, for each of the one or more additional cells, repeating the steps of determining, removing and generating to define the test vectors for each of the one or more additional cells.

3. The method of claim 1, wherein the step of determining comprises the step of associating low ("L"), falling ("F"), high ("H"), rising ("R") states to each input to the one cell.

4. The method of claim 3, wherein the step of removing comprises the step of removing each of the input combinations that has only L or H states.

5. The method of claim 3, further comprising determining common type parallel FETs within the one cell, the step of removing comprising the step of removing each of the input combinations that has both R and F states for inputs connected with the FETs.

6. The method of claim 5, the step of removing further comprising removing each of the input combinations that has (a) a first R or F state associated with inputs connected with the parallel FETs, (b) a second R or F state associated with inputs connected with the parallel FETs, and (c) at least one H or L state associated with inputs connected with the parallel FETs.

7. The method of claim 6, the step of removing further comprising removing each of the input combinations that has multiple R states associated with inputs connected with the parallel FETs that are p-type, the step of removing further comprising the step of removing each of the input combinations that has multiple F states associated with inputs connected with the parallel FETs that are n-type.

8. The method of claim 5, the step of removing further comprising removing each of the input combinations that has a pair of inputs connected to the parallel FETs where one input of the pair of inputs associates with either an R or an F state and (a) the parallel FETs are p-type and the other input of the pair of inputs associates with an L state or (b) the parallel FETs are n-type and the other input of the pair of inputs associates with an H state.

9. The method of claim 5, the step of removing further comprising removing each of the input combinations excluded by mutex commands or input directives.

10. A system for generating test vectors to analyze cells of electronic gates, comprising:

means for electronically selecting one or more cells within a cell library;

means for determining a group of input combinations associating input stimuli with inputs of each of the cells;

means for removing one or more of the input combinations that do not affect maximum and minimum signal propagation timing through the each of the cells; and means for generating the test vectors for each cell based upon remaining input combinations.

11. The system of claim 10, wherein the group of input combinations comprises all input combinations.

12. The system of claim 10, further comprising means for associating low ("L"), falling ("F"), high ("H"), rising ("R") states to each input of each of the cells.

13. The system of claim 12, the means for removing comprising means for removing each of the input combinations that has only L or H states.

14. The system of claim 13, the means for determining comprising means for determining common type FETs that are connected in parallel within the one cell, the means for removing comprising means for removing each of the input combinations that has both R and F states for inputs connected with the parallel FETs.

15. The system of claim 14, the means for removing comprising means for removing each of the input combinations that has:

(a) a first R or F state for inputs connected with the parallel FETs;

(b) a second R or F state for inputs connected with the parallel FETs; and (c) at least one H or L state for inputs connected with the parallel FETs.

16. The system of claim 13, the means for removing comprising: means for removing:

each of the input combinations that has multiple inputs only associated with the R state and connected with the parallel FETs that are p-type; and each of the input combinations that has multiple inputs only associated with the F state and connected with the parallel FETs that are n-type.

17. The system of claim 13, the means for removing comprising means for removing each of the input combinations that has a pair of inputs connected to the parallel FETs where one input of the pair of inputs associates with either an R or an F state and:

(a) the parallel FETs are p-type and the other input of the pair of inputs associates with an L state; or (b) the parallel FETs are n-type and the other input of the pair of inputs associates with an H state.

18. The system of claim 13, the means for removing comprising removing each of the input combinations excluded by one or both of mutex commands or input directives.

* * * * *

UNITED STATES PATENT AND TRADEMARK OFFICE
CERTIFICATE OF CORRECTION

PATENT NO.        : 7,039,886 B2
APPLICATION NO.   : 10/445500
DATED             : May 2, 2006
INVENTOR(S)       : Charles Corey Pie et al.

It is certified that error appears in the above-identified patent and that said Letters Patent is hereby corrected as shown below:

In column 3, line 37, delete "(E;)," and insert -- (F), --, therefor.

Signed and Sealed this

Fourteenth Day of April, 2009

JOHN DOLL
*Acting Director of the United States Patent and Trademark Office*